(12) United States Patent
Hsieh et al.

(10) Patent No.: US 9,951,416 B2
(45) Date of Patent: Apr. 24, 2018

(54) VACUUM COATING APPARATUS

(71) Applicant: Institute of Nuclear Energy Research Atomic Energy Council, Executive Yuan, Taoyuan (TW)

(72) Inventors: Cheng-Chang Hsieh, Taoyuan (TW); Deng-Lian Lin, Taoyuan (TW); En-Shih Chen, Taoyuan (TW); Wen-Fa Tsai, Taoyuan (TW); Chi-Fong Ai, Taoyuan (TW)

(73) Assignee: INSTITUTE OF NUCLEAR ENERGY RESEARCH ATOMIC ENERGY COUNCIL, EXECUTIVE YUAN, Taoyuan (TW)

( * ) Notice: Subject to any disclaimer, the term of this patent is extended or adjusted under 35 U.S.C. 154(b) by 222 days.

(21) Appl. No.: 14/820,648

(22) Filed: Aug. 7, 2015

(65) Prior Publication Data

US 2016/0076143 A1    Mar. 17, 2016

(30) Foreign Application Priority Data

Sep. 16, 2014 (TW) .............................. 103131945 A

(51) Int. Cl.
*H01J 37/34* (2006.01)
*C23C 14/56* (2006.01)
*C23C 14/32* (2006.01)

(52) U.S. Cl.
CPC .......... *C23C 14/562* (2013.01); *C23C 14/325* (2013.01)

(58) Field of Classification Search
CPC .................................................... C23C 14/562
See application file for complete search history.

(56) References Cited

U.S. PATENT DOCUMENTS

| | | | | |
|---|---|---|---|---|
| 3,625,848 A | * | 12/1971 | Snaper | C23C 14/325 |
| | | | | 204/192.11 |
| 6,589,407 B1 | * | 7/2003 | Subramani | H01J 37/32623 |
| | | | | 204/298.06 |
| 2011/0274838 A1 | * | 11/2011 | Villuendas Yuste | C23C 16/545 |
| | | | | 427/251 |
| 2012/0103259 A1 | * | 5/2012 | Cheong | C23C 14/562 |
| | | | | 118/723 R |
| 2014/0158531 A1 | * | 6/2014 | Choi | C23C 14/352 |
| | | | | 204/298.12 |

\* cited by examiner

*Primary Examiner* — Timon Wanga
(74) *Attorney, Agent, or Firm* — WPAT, PC

(57) ABSTRACT

A vacuum coating apparatus includes at least a chamber, an arc discharge plasma source, a feeding-reeling unit, and a roller set. The first and second openings are connecting with the feeding or reeling unit so as to allow the substrate to enter and leave the chamber therethrough, respectively. The arc discharge plasma source located inside the chamber generates the plasma, which discharges radially from the arc discharge plasma source as its center. The roller set includes a plurality of the first rollers, which are located in the chamber and enclosing the arc discharge plasma source. A first surface of the substrate is facing the plurality of the first rollers and contacts tightly on the periphery of the first rollers so that the first rollers can rotate by the moving of the substrate. The material evaporated and emitted by the plasma is attached onto the first surface of the substrate.

12 Claims, 3 Drawing Sheets

VACUUM COATING APPARATUS

This application claims the benefit of Taiwan Patent Application Serial No. 103131945, filed Sep. 16, 2014, the subject matter of which is incorporated herein by reference.

BACKGROUND OF INVENTION

1. Field of the Invention

The invention relates to a vacuum coating apparatus, and more particularly to a large area roll-to-roll type vacuum coating apparatus.

2. Description of the Prior Art

In the art, roll to roll plasma coating method is a high productivity efficiency technology that is capable of continuously and simultaneously performing multi-layer coatings on flexible substrates. By comparing with the traditional batch or in-line plasma coating process, the roll-to-roll plasma coating technology can significantly reduce the production cost. The flexible substrate for the roll-to-roll type process is mainly made of a soft metal plate, a polymer material, which is light, thin, flexible, elastic, workable and transportable. Therefore, such kind of substrates is widely applied to food packing, capacitors, flexible circuit boards, solar cells, 3C products, heat mirrors and so on.

In particular, the global warming induced by the green house effect has recently become one of crucial issues to nations worldwide. Hence, various renewable energy and energy-saving technologies have been development trends nowadays and are expected to have great contribution to the easing of global warming effect.

For example, the heat mirror can effectively prevent the solar heat from entering the building and allow portions of the visible light to penetrate therethrough, so the energy consumption from the cooling systems and the illumination systems of the building can be greatly reduced. However, market prices for heat mirror glasses, Low-E glasses or flexible heat-insulation films are so high that they have not been adopted economically by the general public. Thus, a technology for providing low-cost heat mirrors is an unavoidable trend.

Generally, a heat mirror is a coating film comprising of at least one metal oxide film, and the corresponding manufacturing process can be a reactive magnetron sputtering process employing a metal target in an oxygen atmosphere. However, the reactive magnetron sputtering process is accompanied by a rapid-change hysteresis phenomenon. Also, the target may suffer from toxicity as well as discharging problem. Hence, the stability of the process speed and the coating rate could not be maintained easily. Though the aforesaid shortcomings may be overcome by introducing dual magnetron targets, OES control and plasma power source, yet the investment involved is comparatively high.

Further, the conventional roll-to-roll type vacuum coating apparatus usually uses a magnetron sputtering source as the plasma source for the coating. While the magnetron sputtering source is at work, the distance between the source and the substrate is about 10 cm and an effective width of about 15 cm hence the plasma is localized within some region, resulting in a local temperature hike on the substrate, causing the deforming of the substrate. Therefore, in the art, a large-capacity cooling cylinder shall be added to the conventional roll-to-roll type vacuum coating apparatus so as to avoid possible over-heating deformation upon the substrate. However, the installation of the cooling cylinder would significantly increase both the facilities cost and the energy consumption. Also, the relative motion between the polymer-made substrate and the cooling cylinder would possibly cause scratches on the substrate.

In addition, the conventional flexible substrate in manufacturing can have a length of several thousand meters. A batch manufacturing process of the conventional roll-to-roll type vacuum coating apparatus usually takes tens of hours to finish. Also, in the manufacturing, the target material for the magnetron sputtering source is consumed with time, and the magnetic field strength on the target surface would increase gradually with the processing time. Thereupon, the coating speed and the makeup of the coated film vary with time, so a monitoring system is necessary for feedback controlling.

Hence, how to provide a vacuum coating apparatus, that can perform various continuous vacuum coatings on the flexible substrate with modular designed chambers, that is capable of being arranged for different applications, of finishing the manufacturing process in a single run, so as to increase the yield effectively, lower the cost as well as enhance the product competitiveness, is an important subject.

SUMMARY OF THE INVENTION

Accordingly, it is the primary object of the present invention to provide a vacuum coating apparatus, which can perform various continuous vacuum coating processes upon a flexible substrate with modular designed chambers, that is able to be re-assembled for different applications, capable of finishing the manufacturing process in a single run, so as to increase the yield effectively, lower the cost as well as enhance the product competitiveness.

In the present invention, the vacuum coating apparatus includes at least one chamber, at least one arc discharge plasma source, a feeding-reeling unit and a roller set. The chamber has a first opening and a second opening connecting with the feeding or reeling unit respectively so as to allow the substrate to move in and out of the chamber. The substrate has a first surface and a second surface, which is opposing to the first surface. The arc discharge plasma source locating inside the chamber is to generate the plasma, which discharges radially from the arc discharge plasma source in the chamber. The roller set includes a plurality of first rollers circling the arc plasma discharge source. The first surface of the substrate faces the first rollers and contacts tightly on the periphery of the first rollers so that the first rollers can rotate by the moving of the substrate. The material evaporated and emitted by the plasma is attached onto the first surface of the substrate.

In one embodiment of the present invention, the vacuum coating apparatus includes a plurality of chambers, each of which has a corresponding arc discharge plasma source. The substrate is detoured into each of the plurality of chambers. Each arc discharge plasma source in the respective chamber can generate plasma individually.

All these objects are achieved by the vacuum coating apparatus described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a vacuum coating apparatus. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
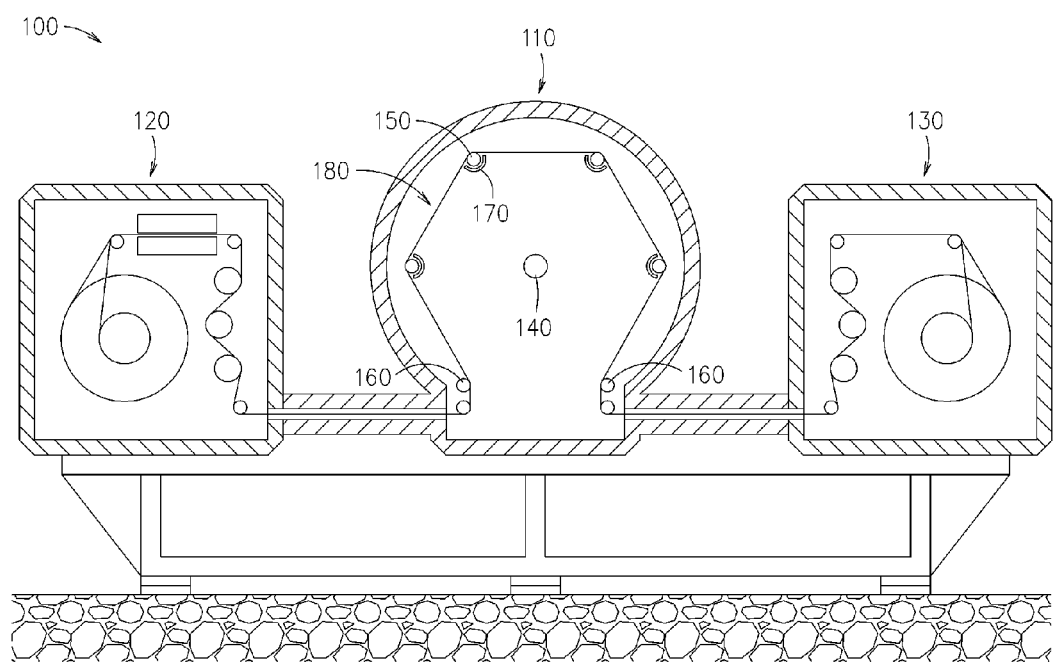
FIG. 1 is a schematic view of a preferred embodiment of the vacuum coating apparatus in accordance with the present invention.
Figure 2:
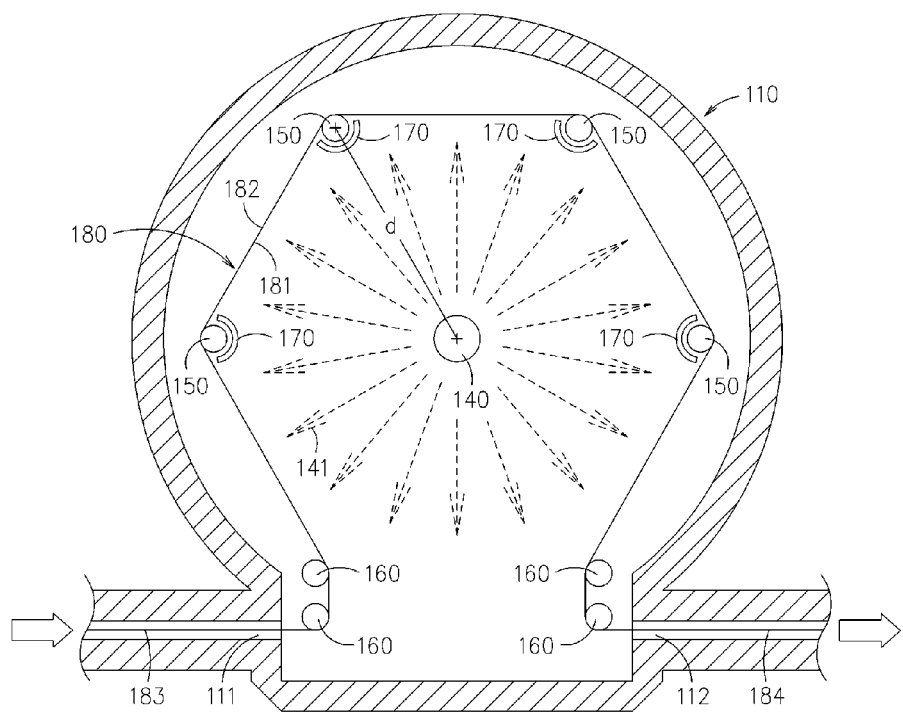
FIG. 2 is an enlarged view of the chamber of FIG. 1.

Referring now to FIG. 1 and FIG. 2, a schematic view of a preferred embodiment of the vacuum coating apparatus. The vacuum coating apparatus 100 includes a cylinder-shaped vacuum chamber 110. The radial cross section view of the chamber 110 is shown in FIG. 1 and FIG. 2. The chamber 110 has a first opening 111 and a second opening 112 located opposing to the first opening 111 inside the chamber 110. A first feeding unit 120 located outside the chamber 110 is mounted at a position close to the first opening 111 and is connecting with the first opening 111. At the other side of the chamber 110, a second feeding unit 130 is mounted close to the second opening 112 and is connecting with the second opening 112. One of the first feeding unit 120 and the second feeding unit 130 is to feed the substrate 180 into the chamber 110, while the other thereof is to reel the substrate 180 leaving the chamber 110. For example, by having the second feeding unit 130 as the unit to reel the substrate 180, the first feeding unit 120 is to feed the substrate 180 to the chamber 110. The substrate 180 enters the chamber 110 through the first opening 111, and leaves the chamber 110 via the second opening 112. In another example, the first feeding unit 120 can be applied as the unit to reel the substrate 180 and the second feeding unit 130 as the unit to feed the substrate 180. In the present invention, the substrate 180 is a flexible coiled material having a specific width with unlimited choices of the materials. The flexible material is chosen according to manufacturing needs. Also, the embodiment of the feeding units in accordance with the present invention is not limited to the aforesaid two opposing feeding/reeling units. In other embodiment not shown here, the two feeding units 120, 130 can be integrated into one single unit capable of feeding and reeling the flexible substrate 180.

Inside the chamber 110, a long cylindrical arc discharge plasma source 140 is placed. The arc discharge plasma source 140 is mounted coaxially with the chamber 110. FIG. 1 and FIG. 2 show the radial cross section of the arc discharge plasma source 140. The arc discharge plasma source 140 is inside the chamber 110 and is to generate the plasma 141. The plasma 141 produced by the arc discharge plasma source is outwardly emitted radially from the arc discharge plasma source 140 as the center.

The chamber 110 further includes a roller set for guiding the moving of the substrate 180 inside the chamber 110. In this embodiment, the roller set consists a plurality of first rollers 150 and a plurality of second rollers 160. Both the first rollers 150 and the second rollers 160 are driven to rotate. The first rollers 150 locate inside the chamber 110 and are mounted around the periphery of arc discharge plasma source 140. Each of the first rollers 150 keeps the same distance d to the arc discharge plasma source 140. The magnitude of the distance d is chosen depending on the manufacturing requirements. For example, the distance d may be within a range of 30-200 cm for typical processes. As shown in FIG. 2, inside the chamber 110, two of the second rollers 160 are mounted close to the first opening 111, while another two thereof are mounted close to the second opening 112. It shall be understood to the ordinary skilled in the art that the arrangement of the first rollers 150 and the second rollers 160 is various, not limited to the pattern shown in this embodiment. For example, in other embodiments, the number of the first rollers 150 is not limited to four as shown in the embodiment. The first rollers 150 might be more than four. And the second rollers 160 may not be limited to a pair of two as shown in this embodiment. Moreover, the second rollers 160 may have one or more than two rollers mounted near the first or second opening 111 or 112, respectively.

Further, in this embodiment, each of the first rollers 150 is paired by a roller shield 170, which is located between the respective first roller 150 and the arc discharge plasma source 140 and closer to the corresponding first roller. By providing the roller shield 170, the respective first roller 150 can have a protection from the adhesion of the evaporated material generated by the plasma 141. In the present invention, the material for the roller shield 170 is not strictly limited, such as stainless steel or other metallic materials.

As shown in FIG. 2, the substrate 180 has a first surface 181, a second surface 182 opposing to the first surface 181, and two opposing ends 183, 184. The first surface 181 of the substrate 180 faces and contacts the plurality of the first rollers 150, and thus the first surface 181 is rolled over and tensed by the first rollers 150 as a polygon due to the flexibility of the substrate 180. The opposing ends 183, 184 of the surface 182 of the substrate 180 are in contact with the second rollers 160 near the first opening 111 and second opening 112 respectively. And the two ends 183, 184 are further extended out of the chamber 110 through the first opening 111 and the second opening 112, respectively.

The operation of the present invention is as follows: While the substrate 180 is driven to move forward by the first feeding unit 120 and the second feeding unit 130, the first rollers 150 are driven to rotate by the passing of the substrate 180 simultaneously. The evaporated material emitted by the plasma 141 from the plasma source 140 is adhered to and thus coated onto the first surface 181 of the substrate 180. By providing the roller shield 170 to each of the first rollers 150, the first rollers 150 can then be prevented from contamination of the evaporated material of the plasma 141. This not only keeps the first roller 150 clean so as to avoid the damage to the substrate 180 caused by the contaminated unshielded first rollers 150, but also protects the first rollers 150 from the high temperature of the plasma 141.

As mentioned above, the substrate 180 is a coiled material with a specific width. In the embodiment structure of the present invention, the effective area of the substrate 180 for coating is about $(1.3-1.6)\pi dW$, in which the d is the distance between the individual first roller 150 and the arc discharge plasma source 140 (equal substantially to the distance between the arc discharge plasma source 140 and the substrate 180), and the W is the width of the substrate 180.

In the embodiment of FIG. 1, if it is needed to coat more than two layers of films onto the substrate 180, a backward-forward control upon the substrate 180 inside the chamber 110 can do this job. The determination of the speeds of the first rollers 150 and the second rollers 160 (if not free rotation), the tension of the substrate 180, and the related parameters are up to the selection of the material of the substrate 180 and the requirement of the coating.

Figure 3:
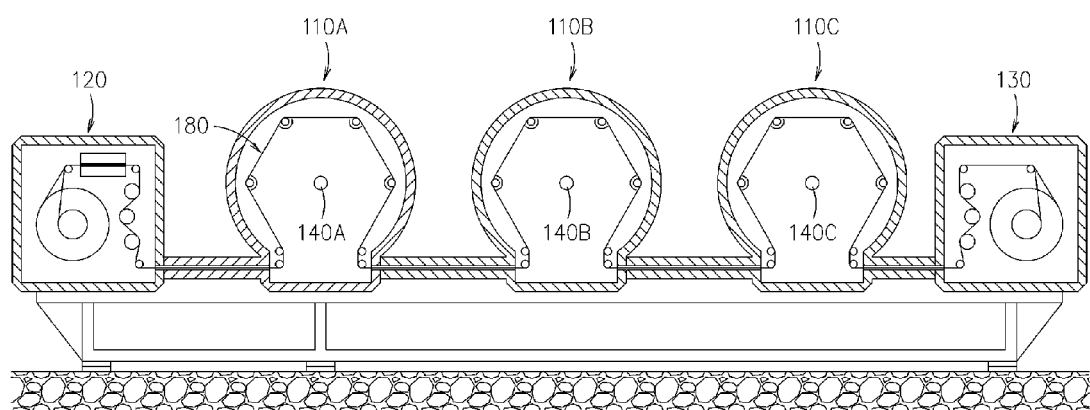
FIG. 3 is a schematic view of another embodiment of the vacuum coating apparatus in accordance with the present invention.

Referring now to FIG. 3, a schematic view of another embodiment of the vacuum coating apparatus in accordance with the present invention is shown. The major difference between this embodiment to the aforesaid embodiment of FIG. 1 is that this embodiment includes a plurality of chambers 110A~110C, each of which has an individual arc discharge plasma source 140A~140C. Similar to the aforesaid embodiment, the vacuum coating apparatus of FIG. 3 also includes a first feeding unit 120 and a second feeding unit 130 (to be mounted to the opposing ends of the plurality of the chambers 140A~140C). The substrate 180 is to go through, in order, each of the chambers 110A~110C. The setup of this embodiment for the vacuum coating apparatus can be applied to relevant manufacturing processes for continuous vacuum multi-layer coating upon a flexible substrate. In the respective chambers 110A~110C, the arc discharge plasma sources 140A~140C can provide the same plasma, or different plasmas. For example, while the arc discharge plasma sources 140A~140C produce the same plasma, then the vacuum coating apparatus of FIG. 3 can be used to form three same layers onto the substrate 180 to meet the thickness requirement. In another example, while the arc discharge plasma sources 140A~140C produce different plasmas, then three different films can be coated in order onto the substrate 180. The chambers of the present invention are modular designed. This design is capable of being arranged for different applications, of finishing the manufacturing process in a single run, so as to increase the yield effectively, lower the cost as well as enhance the product competitiveness. It is also applicable to perform a backward-forward control of the substrate 180 in between the three chambers 110A~110C to obtain thicker or more layers to be coated on the substrate 180. In addition, in the embodiment of FIG. 3, air blocking chambers can be constructed between neighboring chambers (not shown here) to block gaseous molecules in different chambers hence the production stability and the product quality can be enhanced.

In summary, by comparing to the conventional roll-to-roll type vacuum coating apparatus, the vacuum coating apparatus in accordance with the present invention has at least the following advantages.

The vacuum coating apparatus of the present invention has a larger distance between the arc discharge plasma source and the substrate, where the conventional distance is about 10 cm. However the distance of the present invention can be up to 30-200 cm. In addition, the plasma of the present invention is emitted radial-outwardly at omni-ranged (360°) directions. The effective width of the present invention can be up to meters. Also for the polymer substrate of the present invention, it does not have a significant temperature hike during the manufacturing, so no cooling device is needed, such that the cooling device can be removed and thus the production cost can be reduced.

In the present invention, for the distance between the arc discharge plasma source and the substrate is larger, the required amount of the reaction air can be reduced so that the possible toxicity on the target material during the plasma reactive deposition manufacturing process can be effectively prohibited.

In the present invention, it is a large area roll-to-roll type vacuum coating apparatus. The chambers are modular-designed and the structures are simple, with the feature that is capable of performing backward and forward coating manufacturing processes in a single chamber or being reassembled to meet various applicable needs.

In the present invention, the arc plasma discharge source works by arc discharging without the need of any magnets. When working for long periods, the coating rate and the film composition can be maintained and unaffected by the time.

By utilizing the present invention for coating a three-layer film of $TiO_2/TiN/TiO_2$ on a 1000 m PET substrate at respective coating speeds of 2/3/2 m/min., the process time is no more than 25 hours. It is thus proved that the present invention can perform a more-desired productivity. Importantly, the apparatus of the present invention is simply structured, at lower equipment cost and free of the risk of overheating and toxicity.

The aforesaid embodiment is an example for explaining the feature and effect of the present invention. The embodiment is not a limitation to the realization of the present invention. Without departing from the spirit and scope of the present invention, any change or modification referring to the present invention for making equivalent effects are covered by claims as follows.

What is claimed is:

1. A vacuum coating apparatus, comprising:
   at least one feeding unit for feeding or reeling a substrate;
   at least one chamber, each chamber having a first opening and a second opening opposing to the first opening, the first opening and the second opening connecting with the at least one feeding unit respectively, the first opening and the second opening allowing the substrate to enter and leave a respective chamber of the at least one chambers, the substrate having a first surface and a second surface opposing to the first surface;
   at least one arc discharge plasma source, each arc discharge plasma source positioned inside, coaxially with, and at the center of each respective chamber and radially discharging plasma toward the periphery of the respective chamber and the first surface of the substrate; and
   at least one roller set, each roller set having a plurality of first rollers internally and statically mounted in relation to a respective chamber and circling a respective arc discharge plasma source, the first surface of the substrate facing the plurality of the first rollers and contacting tightly at the plurality of the first rollers, the plurality of the first rollers being driven to independently and freely rotate by the moving of the substrate, the evaporated material by the plasma being coated onto the first surface of the substrate.

2. The vacuum coating apparatus of claim 1, wherein each of the first rollers has a roller shield located between the first roller and the respective arc discharge plasma source so as to prevent the evaporated material from adhering the respective first roller.

3. The vacuum coating apparatus of claim 2, wherein the roller shield is made of a metal.

4. The vacuum coating apparatus of claim 1, wherein a distance between each of the first rollers and the arc discharge plasma source is the same.

5. The vacuum coating apparatus of claim 4, wherein the distance is ranged from 30 to 200 cm.

6. The vacuum coating apparatus of claim 1, wherein each roller set further includes a respective plurality of second rollers located inside the respective chamber, at least one of the second rollers being close to the first opening, at least another one of the second rollers being close to the second opening, the substrate further having two ends, of which the second surface thereof contacts tightly with the corresponding second rollers respectively close to the first opening and the second opening, the two ends of the substrate extending out of the respective chamber respectively through the first opening and the second opening.

7. The vacuum coating apparatus of claim 1, wherein the at least one feeding unit includes a first feeding unit and a second feeding unit, the first feeding unit being located external to each chamber and close to the first opening of a respective chamber, the second feeding unit being located external to each chamber and close to the second opening of a respective chamber, one of the first feeding unit and the second feeding unit being to feed the substrate while the other of the first feeding unit and the second feeding unit is to reel the substrate.

8. The vacuum coating apparatus of claim 1, wherein each of the at least one chambers includes a respective one of the at least one arc discharge plasma source, the substrate passing through each of the at least one chambers.

9. The vacuum coating apparatus of claim 8, wherein the at least one arc discharge plasma sources generate more than two types of plasmas.

10. The vacuum coating apparatus of claim 8, wherein each of the at least one arc discharge plasma sources generate the same plasma.

11. The vacuum coating apparatus of claim 1, wherein a first feeding unit of the at least one feeding unit feeds the substrate into a first chamber of the at least one chamber via the first opening of the first chamber, and a second feeding unit of the at least one feeding unit reels the substrate from a second chamber of the at least one chamber via the second opening of the second chamber.

12. The vacuum coating apparatus of claim 11, wherein a third chamber is positioned between the first and second chamber.

\* \* \* \* \*